(12) United States Patent
Park et al.

(10) Patent No.: US 7,175,735 B2
(45) Date of Patent: Feb. 13, 2007

(54) METHOD AND APPARATUS FOR MANUFACTURING COATED CONDUCTOR

(75) Inventors: Chan Park, Changwon (KR); Do-Jun Youm, Daejeon (KR); Ho-Sup Kim, Kimhae (KR); Kook-Chae Chung, Daejeon (KR); Byung-Su Lee, Yeosu (KR); Sun-Me Lim, Daejeon (KR); Hyoung-Joon Kim, Daejeon (KR)

(73) Assignee: Korea Electrotechnology Research Institute (KR)

( * ) Notice: Subject to any disclaimer, the term of this patent is extended or adjusted under 35 U.S.C. 154(b) by 116 days.

(21) Appl. No.: 10/944,608

(22) Filed: Sep. 17, 2004

(65) Prior Publication Data

US 2005/0269021 A1    Dec. 8, 2005

(30) Foreign Application Priority Data

Jun. 2, 2004    (KR) .................... 10-2004-0040086

(51) Int. Cl.
*C09J 5/02* (2006.01)
*B29C 65/66* (2006.01)
*H01L 39/02* (2006.01)
*H01L 39/06* (2006.01)
*B32B 15/04* (2006.01)

(52) U.S. Cl. ................. 156/305; 156/230; 156/242; 156/247; 156/184; 156/289; 427/62; 29/599; 428/930

(58) Field of Classification Search ............. 427/62; 29/599; 428/930, 662; 156/150, 184, 191, 156/192, 230, 232, 235, 236, 237, 242, 278, 156/286, 305, 241

See application file for complete search history.

(56) References Cited

U.S. PATENT DOCUMENTS

| | | | | |
|---|---|---|---|---|
| 3,205,461 A | * | 9/1965 | Anderson | 333/175 |
| 5,416,063 A | * | 5/1995 | Gross et al. | 505/470 |
| 5,855,716 A | * | 1/1999 | Tonucci et al. | 156/230 |
| 5,866,195 A | * | 2/1999 | Lemelson | 427/62 |
| 6,673,387 B1 | * | 1/2004 | Zhang et al. | 427/62 |

\* cited by examiner

*Primary Examiner*—Melvin Mayes
*Assistant Examiner*—Sonya Mazumdar
(74) *Attorney, Agent, or Firm*—Cantor Colburn LLP

(57) ABSTRACT

Disclosed herein is a technique for manufacturing a superconducting tape grown epitaxially by a replication process. According to the technique, a long superconducting tape can be manufactured using a loop-shaped base. Further disclosed is a method for manufacturing a metal oxide device which comprises the steps of forming a solvent-soluble separation layer on a base having a single crystal or textured surface, forming a superconducting layer on the separation layer, forming a support layer on the superconducting layer, and removing the separation layer by dissolution in a solvent. According to the method, it is possible to manufacture a superconducting tape consisting of the superconducting layer and the support layer separated from the bath, and having the same crystallinity as that of the base (replication).

10 Claims, 8 Drawing Sheets

METHOD AND APPARATUS FOR MANUFACTURING COATED CONDUCTOR

BACKGROUND OF THE INVENTION

1. Field of the Invention

The present invention relates to a method and an apparatus for manufacturing a metal oxide device, and more particularly to a method and an apparatus for manufacturing a superconducting coated conductor grown epitaxially by using a replication process.

2. Description of the Related Art

Since the discovery of high-temperature superconductors in 1986, a number of studies on superconducting tapes have been actively undertaken. A powder-in-tube (PIT) technique is commercially used to manufacture first-generation superconducting tapes using Bi-2223. This technique is advantageous in terms of its simplified manufacturing process, but has a disadvantage in that since the angle of grain boundaries is increased due to poor in-plane alignment of superconductors, the critical current of the first-generation superconducting tapes does not reach that of single-crystal superconductors.

To solve the problems of the first-generation superconducting tapes, second-generation superconducting tapes using ReBCO, such as YBCO, have attracted attention. The second-generation superconducting tapes are manufactured by forming a thin film on a metal tape, e.g., a Ni alloy tape. Since the second-generation superconducting tapes are highly biaxially aligned, they advantageously have critical current characteristics substantially identical to single crystal superconductors.

Techniques for manufacturing the second-generation superconducting tapes are conducted in such a manner that an oxide high-temperature superconductor, including YBCO, is biaxially aligned in a direction parallel to a thin film. These techniques are largely divided into the following two processes. The first process is one wherein a base, as a substrate for a superconductor thin film, is designed to have a textured structure, and then a superconductor thin film is formed on the base to render it to be biaxially aligned. The second process is one wherein a template layer sandwiched between a base as a substrate and a superconductor thin film is controlled to have a crystallinity close to a single crystal, regardless of the crystallinity of the base.

The first process is referred to as a "rolling assisted biaxially textured substrate (RABiTS) process", and the second process is referred to as an "ion beam assisted deposition (IBAD) process". In addition to these processes, various processes, including inclined substrate deposition (ISD) and ion beam texture (ITEX), are currently undergoing trial.

However, superconducting layers of the superconducting tapes manufactured by the conventional processes are biaxially oriented, and exist in a polycrystalline state close to a single crystal. For these reasons, the critical current of the superconducting tapes does not reach a value corresponding to that of single-crystal superconductors due to grain boundaries between crystal particles, causing a problem that advantages inherent to superconductors are not sufficiently attainable.

Further, according to prior arts, particularly, the IBAD process, a non-conductive thin film (e.g., MgO or YSZ) is formed on a support layer supporting a device, and then a superconducting layer is formed thereon. Therefore, the support layer and the superconducting layer are electrically separated from each other, making it impossible to bypass an overcurrent into the support layer. According to the RABiTS process, Ni as a magnetic material is used as the support layer. Accordingly, when a superconducting tape formed on the support layer (Ni) is placed inside a magnetic field, characteristics of the superconducting tape are degraded due to a magnetic field induced by the support layer (Ni).

According to prior arts, since the support layer should have a thickness on the order of several tens to several hundreds of micrometers, there is a limitation in controlling the thickness. In addition, since the deposition of the superconductor thin film is dependant on the kind of constituent materials of the support layer, the choice of the materials is limited.

SUMMARY OF THE INVENTION

Therefore, the present invention has been made in view of the above problems of the prior arts, and it is an object of the present invention to provide a method and an apparatus for manufacturing a superconducting tape in a state close to a single crystal by continuously replicating a thin film from an ideally aligned base.

It is another object of the present invention to provide a method and an apparatus for manufacturing a superconducting tape by bringing a superconducting layer into direct contact with a metal support layer, allowing bypass of an overcurrent into the support layer.

It is another object of the present invention to provide a method and an apparatus for manufacturing a superconducting tape by using a support layer instead of a magnetic material so as not to be influenced by a magnetic field.

It is yet another object of the present invention to provide a method and an apparatus for manufacturing a superconducting tape wherein the thickness and constituent material of a support layer can be freely selected.

In accordance with one embodiment of the present invention, the above objects can be accomplished by an apparatus for manufacturing a thin film tape comprising a rotation-driving unit for rotating a loop-shaped base, a separation layer-deposition chamber for continuously depositing a separation layer on the base as the base is rotated, at least one thin film-deposition chamber for depositing at least one thin film on the separation layer, and a separation chamber for removing the separation layer and separating the thin film from the base to manufacture a thin film tape. Each of the deposition and separation chambers has an inlet port through which the base passes and is introduced into the corresponding chamber, and an outlet port through which the base is discharged from the corresponding chamber. The apparatus according to the present invention may further comprise at least one buffer chamber interposed between the deposition chambers and the separation chamber.

Further, the apparatus of the present invention further comprises a take-up chamber including a take-up roll for winding and storing the thin film tape separated from the base. The apparatus of the present invention further comprises at least one thin film-deposition chamber interposed between the take-up chamber and the separation chamber.

In accordance with another embodiment of the present invention, there is provided an apparatus for manufacturing a thin film tape comprising a cylindrical support for supporting a loop-shaped base and adhered to a bottom face of the base, a rotation-driving unit for rotating the cylindrical support and the base adhered to the top face of the support, a separation layer-deposition chamber for continuously depositing a solvent-soluble separation layer on the base as the base is rotated, at least one thin film-deposition chamber for depositing at least one thin film on the separation layer, a separation chamber for removing the separation layer and separating the thin film from the base to manufacture a thin film tape, and at least one buffer chamber interposed between the deposition chambers and the separation chamber wherein all of the chambers are arranged in a circular shape, and have respective inlet and outlet ports through which both the base and the cylindrical support pass.

The thin film-deposition chambers include an oxide-deposition chamber for depositing a metal oxide layer, and a support layer-deposition chamber for depositing a support layer supporting the metal oxide layer.

According to the apparatus of the present invention, a long superconducting tape composed of a metal oxide, e.g., a superconductor, can be manufactured from the loop-shaped base.

In accordance with another embodiment of the present invention, the above objects can be accomplished by a method for manufacturing a metal oxide device comprising the steps of: forming a separation layer on a base having a single-crystal or textured surface; forming a metal oxide layer on the separation layer; forming a support layer on the metal oxide layer; and removing the separation layer. According to the method of the present invention, a multilayer thin film tape consisting of the single crystalline metal oxide layer and the support layer separated from the base can be manufactured.

Preferably, the base is a circular or conveyer loop in shape. The use of the loop-shaped base enables manufacture of a long superconducting tape composed of a metal oxide, for example, a superconductor.

It is preferable to additionally form a buffer layer between the separation layer and the metal oxide layer. The buffer layer acts to stably deposit the metal oxide layer. Further, it is preferable to form another metal oxide layer on the structure consisting of the support layer, the metal oxide layer and the buffer layer.

The separation layer is made of a material, such as BaO, NaCl or KCl, soluble in a solvent (e.g., water) so that it can be easily removed from the base to manufacture a device composed of the multilayer thin film formed on the separation layer.

The method of the present invention is characterized in that the separation layer, the metal oxide layer and the buffer layer are epitaxially grown along an alignment of the base surface. It is thus possible to epitaxially grow a metal oxide device in which the single crystallinity of the base is replicated.

In accordance with another embodiment of the present invention, there is provided a method for manufacturing a metal oxide device comprising the steps of forming a separation layer on a base having a single-crystal or textured surface, forming a support layer on the separation layer, removing the separation layer to separate the support layer from the base, and forming a metal oxide layer on the support layer.

It is preferable to additionally form a buffer layer between the separation layer and the metal oxide layer. The buffer layer acts to stably deposit the metal oxide layer. A protective layer is preferably formed on the metal oxide layer. The protective layer functions to prevent the characteristics of the metal oxide layer from being deteriorated by impurities.

Preferably, the base is a circular or conveyer loop in shape. The use of the loop-shaped base enables manufacture of a long superconducting tape composed of a metal oxide, for example, a superconductor.

The separation layer is made of a material, such as BaO, NaCl or KCl, soluble in a solvent (e.g., water) so that it can be easily removed from the base to manufacture a device composed of the multilayer thin film formed on the separation layer.

The method of the present invention is characterized in that the support layer, the buffer layer and the metal oxide layer are epitaxially grown along an alignment of the base surface. It is thus possible to epitaxially grow a metal oxide device in which the single crystallinity of the base is replicated.

Metal oxide devices that can be manufactured by the method of the present invention may be applied to a wide variety of devices composed of metal oxides, for example, ferroelectric multilayer thin films and optoelectronic devices, in addition to superconducting tapes, but the present invention is not limited these devices.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The preferred embodiments of the present invention will now be described in more detail with reference to the accompanying drawings. However, these embodiments are given for the purpose of illustration and are not to be construed as limiting the scope of the invention.

Figure 1:
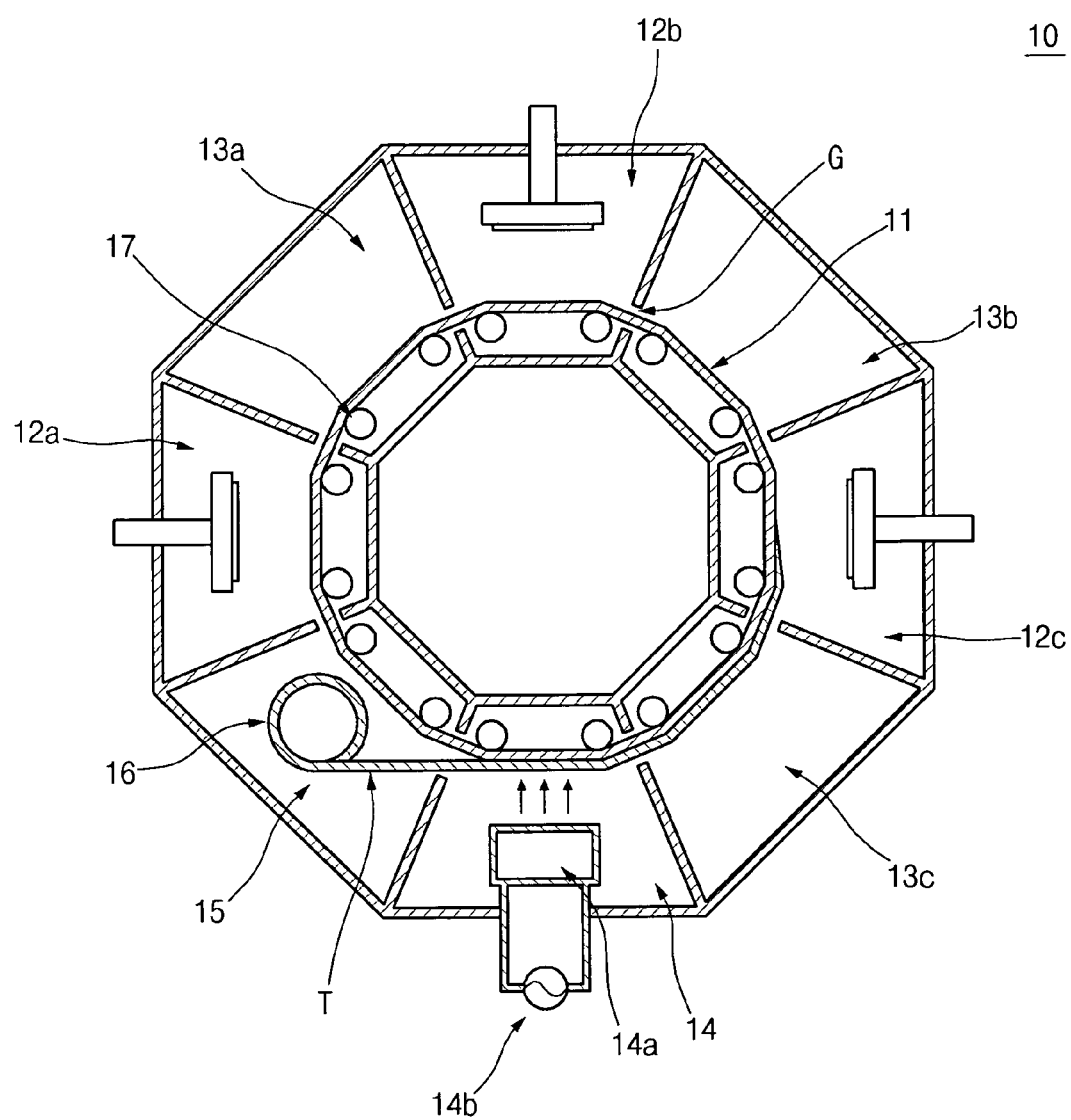
FIG. 1 is a schematic view showing an apparatus for manufacturing a thin layer tape according to one embodiment of the present invention.

FIG. 1 is a schematic view showing an apparatus 10 for manufacturing a thin layer tape according to one embodiment of the present invention.

As shown in FIG. 1, the apparatus 10 comprises deposition chambers 12a, 12b and 12c for depositing thin films on a loop-shaped base 11, a separation chamber 14 for separating the thin films deposited on the base from the base to manufacture a thin film tape T, and a rotation-driving unit 17 for rotating the base. If necessary, the apparatus of the present invention further comprises buffer chambers 13a, 13b and 13c interposed between the respective deposition chambers, and a take-up chamber 15 including a take-up roll 16 for winding and storing the thin film tape T separated from the base 11 in the separation chamber 14.

The base 11 may be made of various materials, and is preferably made of Ni, Pt, or an alloy thereof. The shape of the base is preferably a continuous loop-shaped single-crystal tape, but is not limited thereto. Various modifications, e.g., belts, to the shape of the base are possible.

Figure 2:
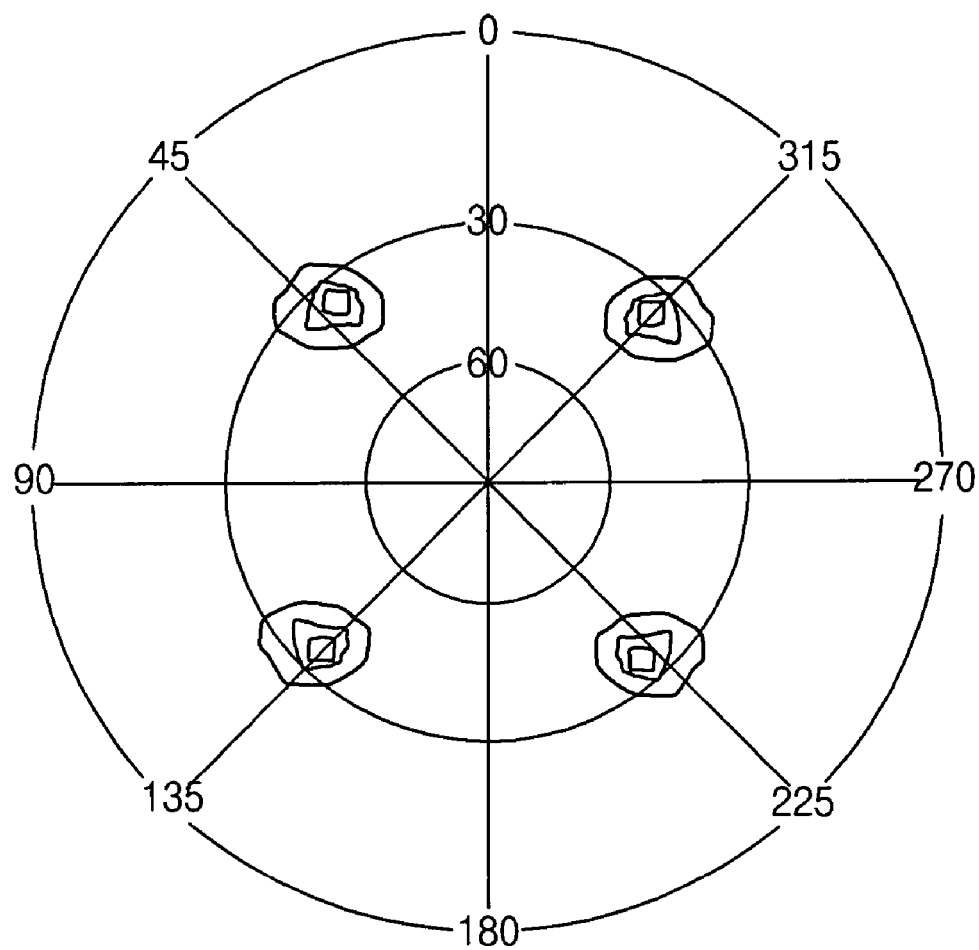
FIG. 2 is an X-ray pole figure of a contact face at which both ends of a biaxially textured Ni tape are joined to each other.

The tape for the base can be produced in various ways. For example, the tape may be produced by thinly cutting a 1 m long and single-crystal metal rod into a few pieces, and joining both ends of the pieces to each other. The joining can be achieved by a number of processes, for example, an atom diffusion process wherein metal atoms are diffused by heating the metal to just below the melting point of the metal. FIG. 2 shows the XRD analytical results concerning the crystallinity of a contact face at which both ends of a biaxially textured Ni tape are joined to each other at 1,400° C. by the atom diffusion process. As can be seen from FIG. 2, the crystallinity inherent to the single-crystal tape remains unchanged. As one example, the thin single-crystal tape can be produced by depositing a metal, e.g., Ni or Pt, on a large-area single-crystal substrate, e.g., sapphire or silicon, and separating the deposited metal layer from the substrate. As another example, the single-crystal tape can be produced from a metal whose surface is biaxially textured. The biaxially textured metal can be obtained by the conventional RABiTS or IBAD process. Since these processes are obvious to those skilled in the art of superconducting tapes, their detailed explanations are omitted.

The thickness of the tape for the base is preferably 0.2 mm or larger. For suitable strength, a plurality of tapes can be layered to produce the tape. The single-crystal tape thus produced may be directly used as the base 11 supported by the rotation-driving unit 17.

The deposition chambers 12a, 12b and 13c may be various kinds of thin film-deposition apparatuses for sputtering, pulsed laser deposition (PLD), chemical vapor deposition (CVD), E-beam deposition, sol-gel deposition, etc., and are selected depending on the type and application of thin films to be deposited. FIG. 1 shows a sputtering deposition apparatus.

The buffer chambers 13a, 13b and 13c are interposed between the respective deposition chambers 12a, 12b and 12c, and the separation chamber 14. In the case where thin film-deposition processes, and kind and pressure of process gases used in the adjacent deposition chambers are different, the buffer chambers are arranged in order to minimize the influence by the different conditions of the adjacent deposition chambers. A gas injection port (not shown) and a vacuum unit (not shown) are connected to each of the buffer chambers so that the internal pressure of the buffer chamber can be independently controlled differently from adjacent chambers. Although one buffer chamber is arranged between the adjacent deposition chambers, or between one deposition chamber and the separation chamber, as shown in FIG. 1, two or more buffer chambers may be arranged. If two or more buffer chambers are interposed between two deposition chambers, or between one deposition chamber and the separation chamber, the internal pressure of the buffer chambers is controlled so as to provide process conditions similar to those of the adjacent deposition chamber, thereby stably proceeding the processes of the deposition chambers.

The separation chamber 14 includes a water bath 14a, and a heater (not shown) for generating water vapor from the water bath 14a. A power supply 14b is connected to the heater to control the temperature of the heater. The pressure of water vapor generated from the water bath can be controlled by the action of the heater 14a. The water vapor is used to dissolve the separation layer deposited on the base, and as a result, is the thin film tape T composed of the superconducting layer is separated from the base. Water vapor has been described as a material capable of dissolving and removing the separation layer, but the present invention is not limited to water vapor. For these purposes, numerous materials and means, such as water jet and chemical vapor, can be used.

The take-up chamber 15 is arranged at the rear side of the separation chamber 14, and includes the take-up roll 16 for winding and storing the thin film tape T separated from the base in the separation chamber. The take-up roll 16 winds the thin film tape T separated in the separation chamber. Since the take-up roll 16 is widely used in the art of superconducting tapes, detailed explanations regarding the take-up roll are omitted.

The rotation-driving unit 17 rotates the base. As shown in FIG. 1, the rotation-driving unit 17 is arranged inside the deposition chambers 12a, 12b and 12c, the buffer chambers 13a, 13b and 13c, and the separation chamber 14. The rotation-driving unit 17 includes driving means having a rotatory force, and a plurality of guide reels driven by the driving means.

On the other hand, since the loop-shaped base should be introduced into and discharged from the chambers by the rotatory force of the rotation-driving unit, each of the chambers includes an inlet port and an outlet port at predetermined positions. Since the deposition chambers may have different process atmospheres from the adjacent buffer chambers, each of the inlet and outlet ports is formed with a hole G small enough to barely allow the base to pass therethrough in order to minimize the influence by the different conditions of the adjacent chambers.

Figure 4:
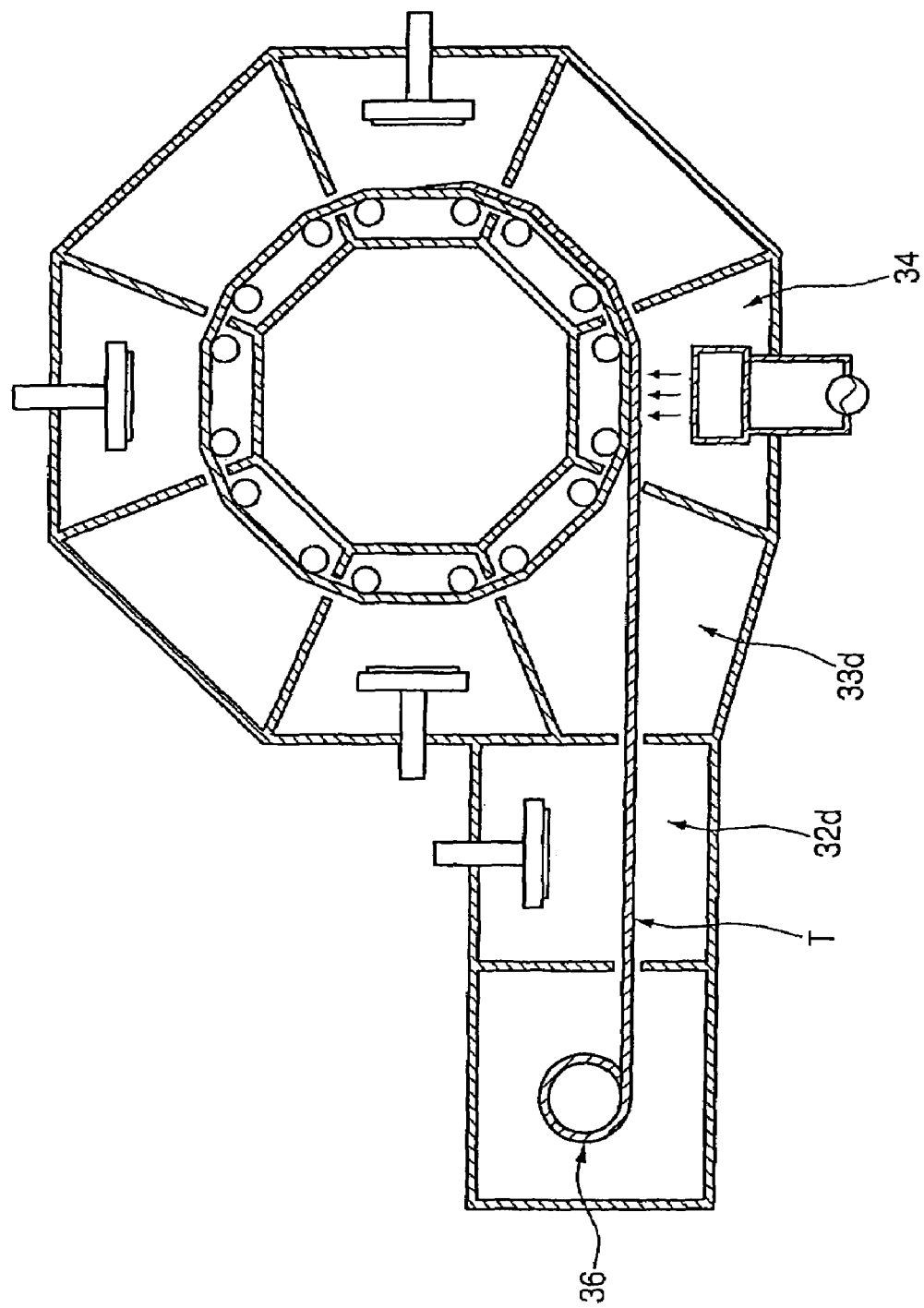
FIG. 4 is a schematic view showing an apparatus for manufacturing a thin layer tape according to another embodiment of the present invention.

Although no chamber is arranged between the take-up chamber 15 and the separation chamber 14, as shown in FIG. 1, another chamber may be arranged to deposit a thin film on the thin film tape T separated in the separation chamber 14. That is, a deposition chamber 32d and a buffer chamber 33d are interposed between a separation 34 and a take-up chamber 36, as shown in FIG. 4. According to this structure, another thin film is deposited on the thin film tape T. In this manner, various modifications to the apparatus of the present invention are possible.

Figure 3:
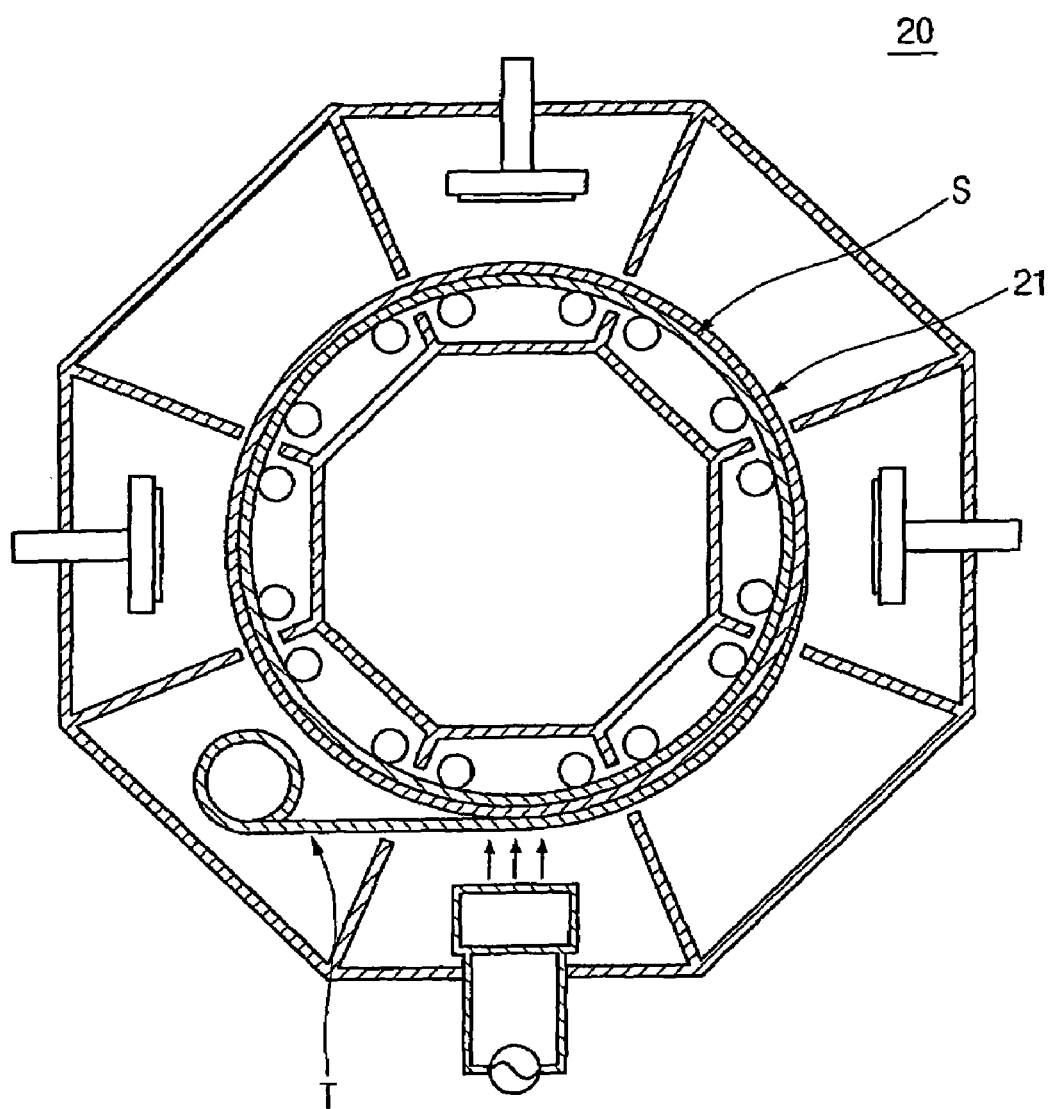
FIG. 3 is a schematic view showing an apparatus for manufacturing a thin layer tape according to another embodiment of the present invention.

FIG. 3 is a schematic view showing an apparatus 20 for manufacturing a thin layer tape according to another embodiment of the present invention. Since the single-crystal tape manufactured in the previous embodiment can be easily deformed by an externally applied force, such as a rotatory force of the rotation-driving unit, a cylindrical support S rotationally driven by the rotation-driving unit is arranged, and a tape for the base 21 is arranged so as to surround the outer surface of the cylindrical support S, as shown in FIG. 3, thereby preventing the deformation of the tape. Other constitutions are identical to those shown in FIG. 1, and thus detailed explanations are omitted.

Figure 5:
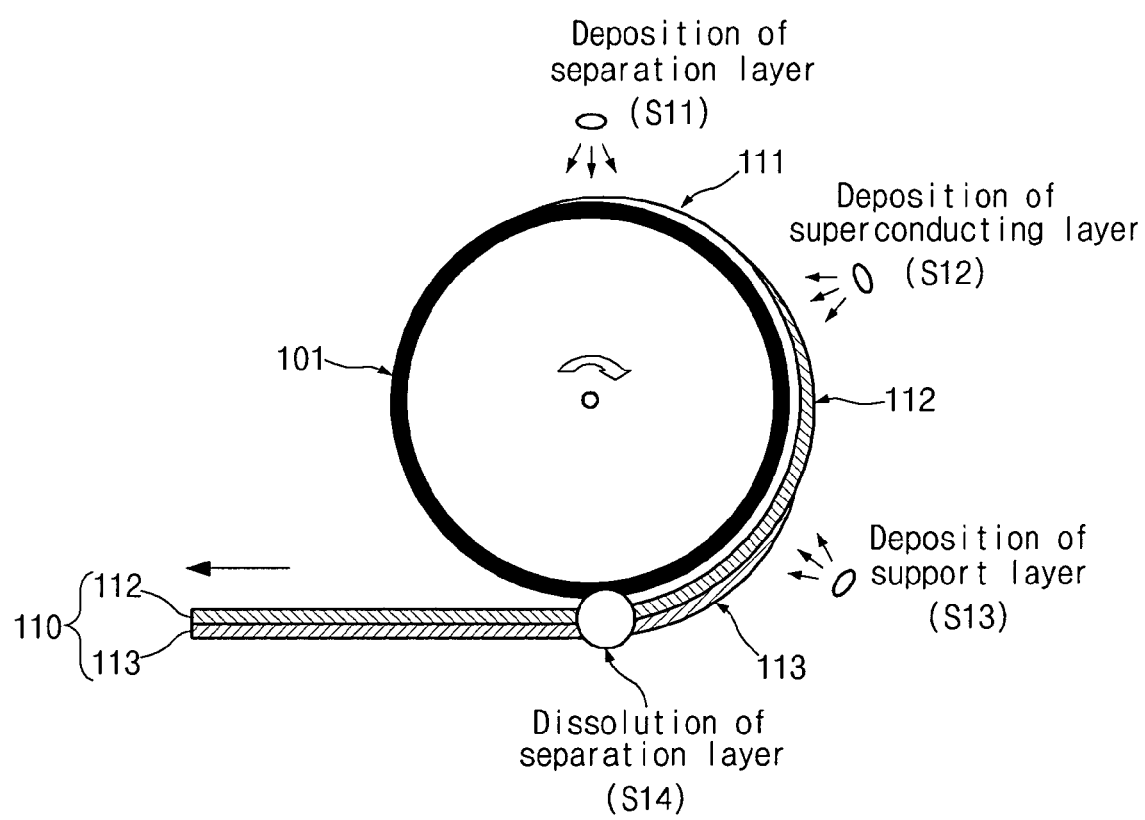
FIG. 5 is a schematic view showing the procedure of a method for manufacturing a superconducting tape using an apparatus of the present invention, in accordance with one embodiment of the present invention.
Figure 6:
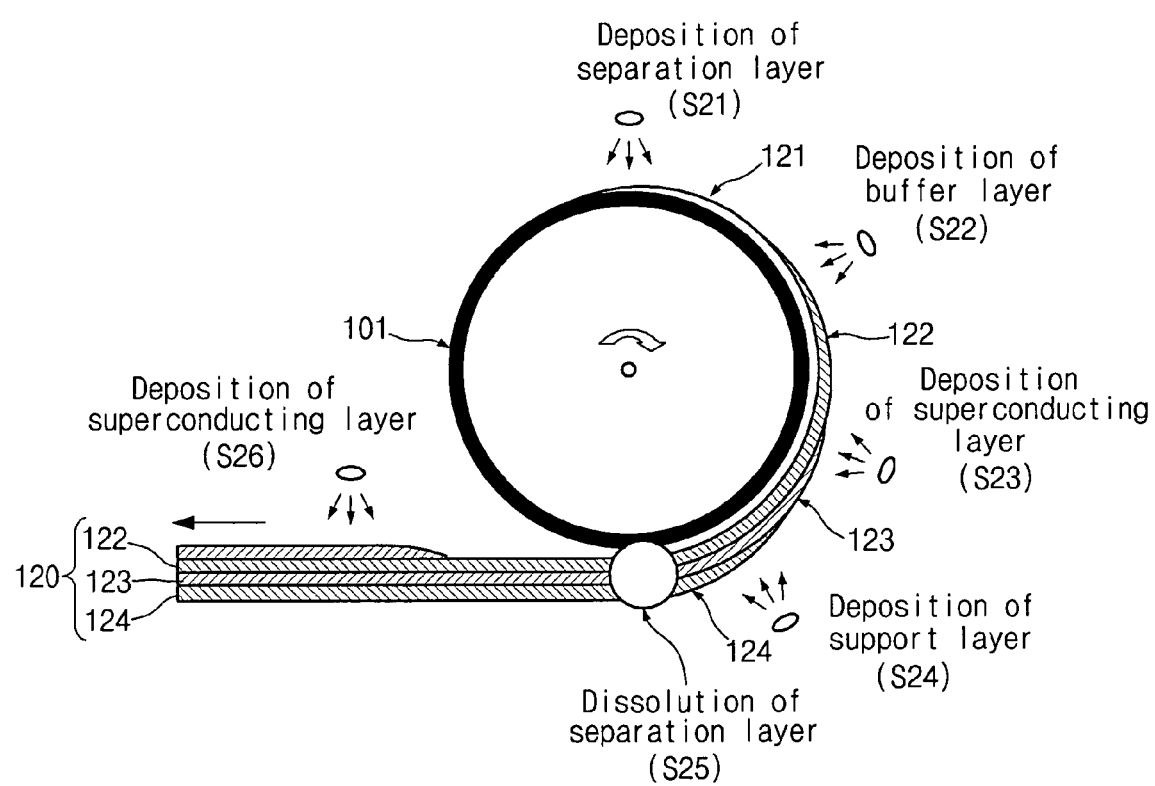
FIG. 6 is a schematic view showing the procedure of a method for manufacturing a superconducting tape using an apparatus of the present invention, in accordance with another embodiment of the present invention.
Figure 8:
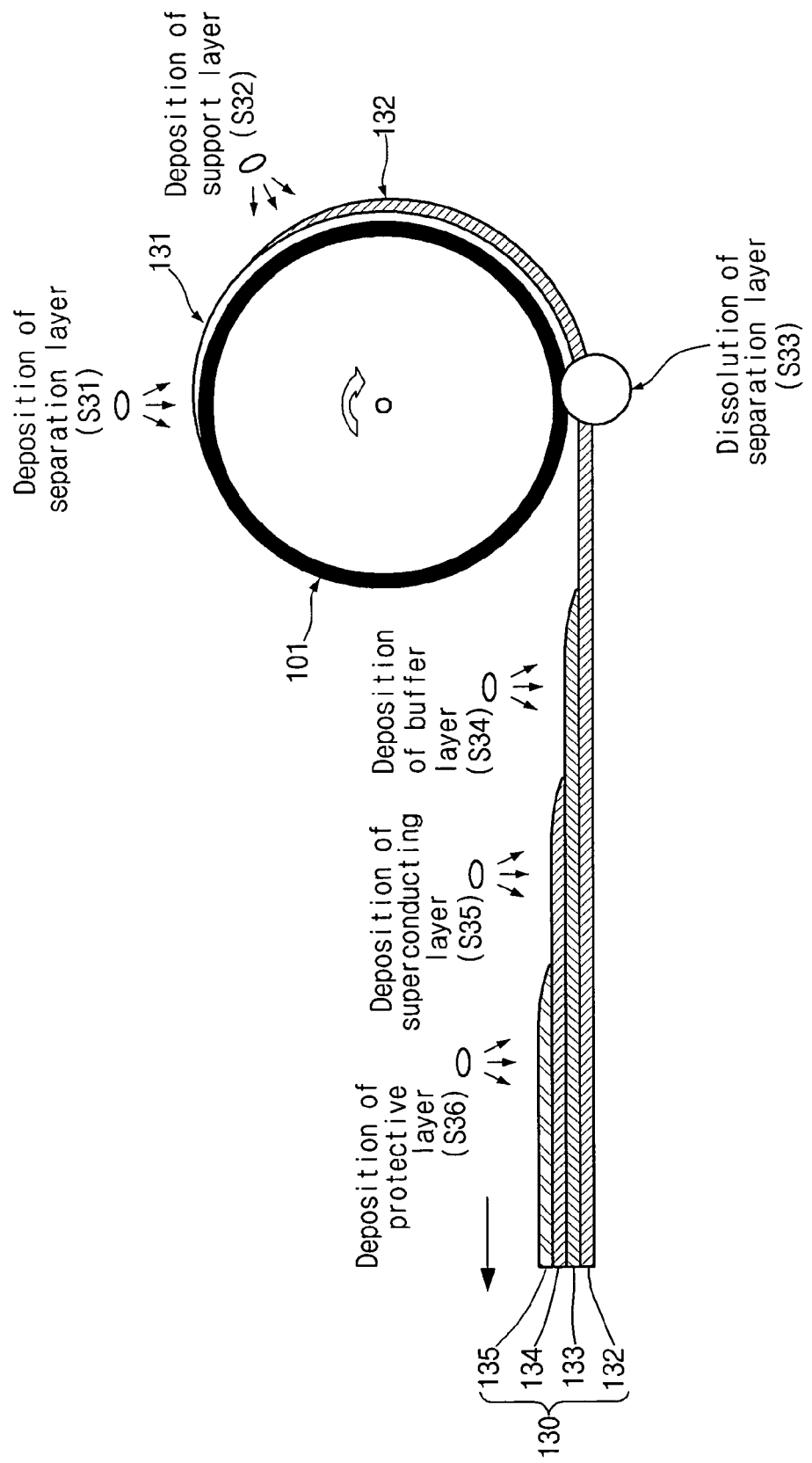
FIG. 8 is a schematic view showing the procedure of a method for manufacturing a superconducting tape using an apparatus of the present invention, in accordance with another embodiment of the present invention.

FIGS. 5, 6 and 8 show the procedures of methods for manufacturing a superconducting tape using the apparatuses of the present invention.

FIG. 5 is a schematic view showing the procedure of a method for manufacturing a superconducting tape according to one embodiment of the present invention. First, a separation layer 111 is deposited using a deposition apparatus provided at one side of a rotating base 101 (S11). The separation layer is crystal-grown in an epitaxial manner on the surface of the base made of a single crystal metal, and is composed of a material soluble in a solvent, such as water. The material constituting the separation layer may be BaO, NaCl, KCl, etc.

Following the deposition of the separation layer, a superconductor thin film 112 is deposited on the separation layer (S12). The superconductor is preferably $YBa_2Cu_3O_9$ (YBCO), but is not restricted thereto. The thin film can be composed of various kinds of metal oxides.

A support layer 113 is formed on the superconductor thin film (S13). The support layer, serving as a physical support of the superconducting layer, is made of a stress-resistant and high strength material. The support layer is formed by depositing a high strength non-magnetic alloy or a composite layer of a metal and a non-metal at low temperature. Pt, Cu, Au, Ag, or an alloy or a composite layer thereof can be used to constitute the support layer. Since the formation of the support layer follows the formation of the superconducting layer, the thickness and constituent materials of the support layer can be freely selected over prior arts. Further, since the support layer is in direct contact with the superconducting layer, the support layer is electrically contacted with the superconducting layer, allowing bypass of an overcurrent into the support layer.

Next, the separation layer is dissolved in a solvent, e.g., water, to separate a multilayer thin film tape 110 consisting of the superconducting layer 112 and the support layer 113 from the base (S14). Although not shown, another thin film may be formed on the multilayer thin film.

In accordance with this procedure, the multilayer thin film tape consisting of the superconducting layer and the support layer can be fabricated. Further, a long superconducting tape 110 can be continuously manufactured as the base is rotated.

FIG. 6 is a schematic view showing the procedure of a method for manufacturing a superconducting tape according to another embodiment of the present invention.

The procedure shown in FIG. 6 is different from that shown in FIG. 5 in that a buffer layer 122 is further formed (S22) following the deposition of a separation layer 121 (S21). The buffer layer plays a roll in assisting a superconducting layer to be stably deposited thereon. As the buffer layer, there may be used various thin films such as $CeO_2$, $Y_2O_3$, YSZ, $SrTiO_3$, $LaNiO_3$, $Re_2O_3$, MgO thin films, and the like.

Similarly to the procedure shown in FIG. 5, after a superconducting layer 123 and a support layer 124 are formed on the buffer layer (S23 and S24), the separation layer is dissolved to separate a multilayer thin film tape 120 consisting of the buffer layer 122, the superconducting layer 123, and the support layer 124 from a base (S25).

The separated multilayer thin film tape can be directly used as a superconducting tape. As another modification, a superconductor thin film is further formed on the multilayer thin film tape 120 (S26). It is obvious that the multilayer thin film tape consisting of the buffer layer, the superconducting layer, the support layer and the superconducting layer has superior current-carrying capability to the multilayer thin film tape 120 composed of a single-layer superconductor.

Figure 7:
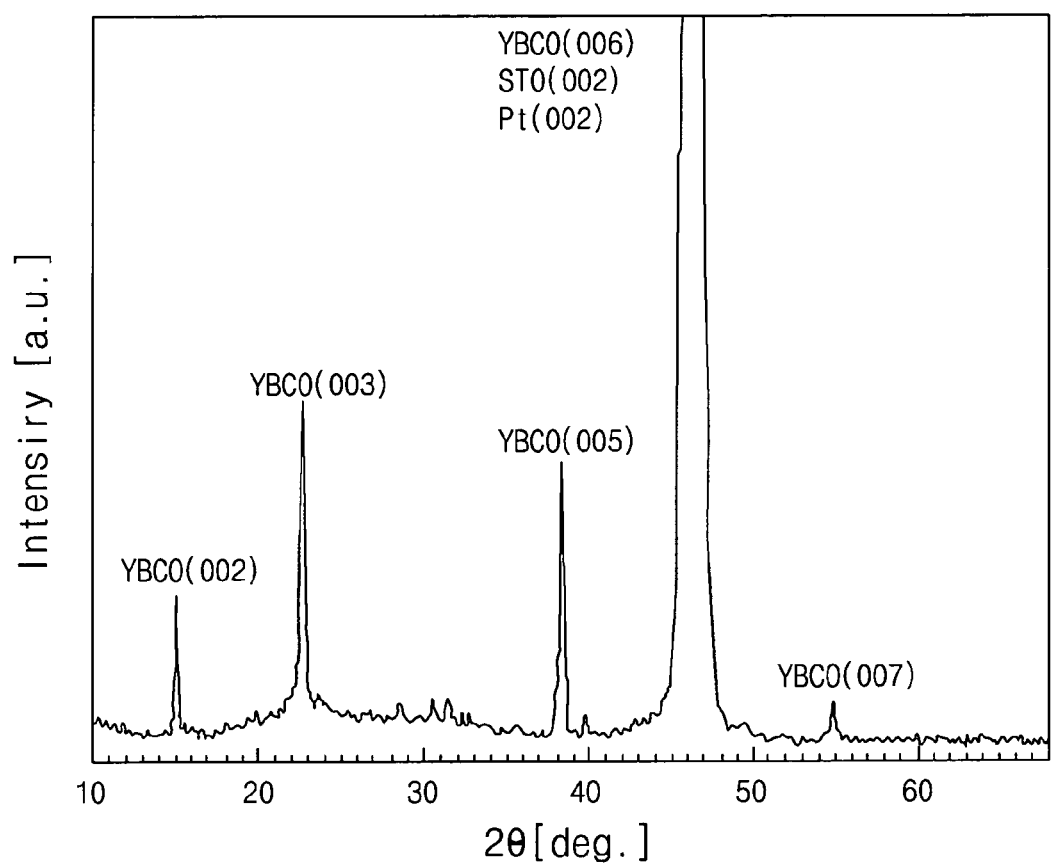
FIG. 7 is an XRD graph of a superconducting tape manufactured in accordance with the procedure shown in FIG. 6.

FIG. 7 is an XRD graph of a $SrTiO_3$/YBCO/Pt multilayer thin film tape manufactured by sequentially forming a BaO separation layer, a $SrTiO_3$ buffer layer, a YBCO superconducting layer, and a Pt support layer on a Ni base, and immersing the resultant structure in water to dissolve the BaO separation layer. As is apparent from FIG. 7, the superconducting layer has good crystallinity identical to that of common superconductors.

FIG. 8 is a schematic view showing the procedure of a method for manufacturing a superconducting tape according to another embodiment of the present invention.

A separation layer 131 and a support layer 132 are sequentially deposited on a base (S31 and S32), and then the separation layer 131 is removed (S33) to produce a tape composed of the support layer only.

Thereafter, a buffer layer 133 and a superconducting layer 134 are sequentially formed on the tape (S34 and S35) to obtain a multilayer thin film tape 130 composed of the support layer, the buffer layer, and the superconducting layer.

A protective layer 135 may be formed on the metal oxide layer of the device (S36). The protective layer 135 serves to prevent the characteristics of the metal oxide layer from being modified or deteriorated by impurities.

On the other hand, since the support layer formed in S33 is formed along a crystal direction of the underlying base, it is a single crystal, or is a tape close to a single crystal. Accordingly, the use of the long single-crystalline support layer as another base enables replication of a superconducting tape. Specifically, the replication is achieved by sequentially depositing a separation layer, a buffer layer, a superconducting layer and another support layer on the single-crystalline support layer, and removing the separation layer.

The separation layer, the buffer layer and the superconducting layer are epitaxially grown depending on the crystal structure of the underlying base. Accordingly, the superconducting layer has a crystal structure identical to the single crystallinity of the base. In conclusion, the method for manufacturing a superconducting tape according to the present invention is comparable to DNA replication.

In order to successfully implement this method, the apparatus for manufacturing a thin film tape according to the present invention should comprise deposition chambers, including a deposition chamber for depositing a solvent-soluble separation layer, a deposition chamber for depositing a superconducting layer, a deposition chamber for depositing a support layer, a deposition chamber for depositing a buffer layer, a deposition chamber for depositing a protective layer, and the like. These deposition chambers are suitably selected and arranged as described in the above embodiment, i.e. according to the intended structure of a thin film tape.

Although the superconducting tape as a metal oxide device has been described in the foregoing embodiments and the accompanying drawings, it is apparent that the method of the present invention can be applied to manufacture various devices composed of metal oxides, including ferroelectric and optoelectronic devices.

As apparent from the above description, according to the method of the present invention, since the superconducting tape at a single-crystal level is manufactured by continuously replicating a single-crystal superconductor thin film on an ideally aligned base, the critical current density can be maintained at a level identical to that of a single crystal.

Further, since the supporting layer of the device is in direct contact with the superconducting layer, the support layer is electrically contacted with the superconducting layer, thereby enabling manufacture of a superconducting tape capable of allowing bypass of an overcurrent into the support layer.

Further, since the support layer is used instead of a magnetic material, the superconducting tape can be less influenced by a magnetic field.

Moreover, since the support layer is deposited following the formation of the superconducting layer, the thickness and constituent materials of the support layer can be freely selected over prior arts.

Although the foregoing embodiments of the present invention have been disclosed with reference to the accompanying drawings, they are not to be construed as limiting the scope of the present invention. The scope of the present invention is defined by the claims that follow, and those skilled in the art will appreciate that various modifications and changes can be made in the spirit of the present invention. Accordingly, it is to be understood that such modifications and changes are within the scope of the present invention.

What is claimed is:

1. A method for manufacturing a metal oxide device, comprising the steps of:
    (a) forming a separation layer on a base having a single crystal or textured surface;
    (b) forming a buffer layer on the separation layer;
    (c) forming a metal oxide layer on the buffer layer;
    (d) forming a support layer on the metal oxide layer; and
    (e) removing the separation layer to separate a multilayer thin film consisting of the metal oxide layer, buffer layer, and the support layer from the base; and
    (f) forming another metal oxide layer on the structure consisting of the support layer, the metal oxide layer and the buffer layer.

2. The method according to claim 1, wherein the base is a circular or conveyer loop in shape.

3. The method according to claim 1, wherein the metal oxide device is one selected from the group consisting of superconducting tapes, ferroelectric multilayer thin films, and optoelectronic devices.

4. The method according to claim 1, wherein the separation layer is made of a material soluble in a solvent.

5. The method according to claim 4, wherein the separation layer is made of a material selected from the group consisting of BaO, NaCl, and KCl.

6. The method according to claim 1, wherein the separation layer and the metal oxide layer are epitaxially grown along an alignment of the base.

7. The method according to claim 2, wherein the separation layer is made of a material soluble in a solvent.

8. The method according to claim 3, wherein the separation layer is made of a material soluble in a solvent.

9. The method according to claim 2, wherein the separation layer and the metal oxide layer are epitaxially grown along an alignment of the base.

10. The method according to claim 3, wherein the separation layer and the metal oxide layer are epitaxially grown along an alignment of the base.

* * * * *